United States Patent
Plesník

(10) Patent No.: US 12,324,106 B2
(45) Date of Patent: Jun. 3, 2025

(54) CLOSED SYSTEM FOR PLACING INSTALLATIONS, ESPECIALLY ELECTRICAL ONES

(71) Applicant: ATHEX TECHNOLOGY S.R.O, Kudlov (CZ)

(72) Inventor: Vít Plesník, Brno (CZ)

(73) Assignee: ATHEX TECHNOLOGY S.R.O., Brno (CZ)

( * ) Notice: Subject to any disclaimer, the term of this patent is extended or adjusted under 35 U.S.C. 154(b) by 763 days.

(21) Appl. No.: 17/273,792

(22) PCT Filed: Sep. 3, 2019

(86) PCT No.: PCT/CZ2019/000044
§ 371 (c)(1),
(2) Date: Mar. 5, 2021

(87) PCT Pub. No.: WO2020/048555
PCT Pub. Date: Mar. 12, 2020

(65) Prior Publication Data
US 2021/0360801 A1    Nov. 18, 2021

(51) Int. Cl.
*B23P 19/00*   (2006.01)
*H05K 5/00*   (2006.01)

(52) U.S. Cl.
CPC ................... *H05K 5/0017* (2013.01)

(58) Field of Classification Search
CPC ........................... H05K 5/0017; H05K 5/0021
See application file for complete search history.

(56) References Cited

U.S. PATENT DOCUMENTS

| 5,197,239 | A  | * | 3/1993  | Glynn ...................... | E04G 5/12 |
|           |    |   |         |                              | 52/63     |
| 6,081,048 | A  | * | 6/2000  | Bergmann ........... | H05K 7/1477 |
|           |    |   |         |                              | 307/147   |
| 2013/0301267 | A1 | * | 11/2013 | Badley .................. | F21V 23/002 |
|           |    |   |         |                              | 362/249.1 |
| 2015/0275652 | A1 | * | 10/2015 | Fanini ................... | E21B 47/017 |
|           |    |   |         |                              | 166/162   |

* cited by examiner

*Primary Examiner* — Paul D Kim
(74) *Attorney, Agent, or Firm* — Michael J. Feingin, Esq.; Feigin and Fridman LLC

(57) ABSTRACT

A closed system for placing installations, especially electrical ones

The closed system for placing installations is formed by interconnected chamber modules (1, 2, 3, 4, 5) of a rectangular top view. In the connection area, the adjacent modules (1,2,3,4,5) are provided with lowered edges which overlap, and in the overlap area vertical through holes (9) are provided for module (1,2,3,4,5) fasteners. The fasteners consist of screws (11) and nuts (12). The lowered edges are provided in the horizontal abutting surfaces with horizontal coaxial passages (10). These passages (10) connect the chambers (6) of adjacent modules (1,2,3,4,5) and cables pass through them. The passages (10) are provided with a sealing grommet (13) which is made of a resilient material. The chamber modules (1,2,3,4,5) consist of two caps (7, 8) attached to each other.

5 Claims, 2 Drawing Sheets

CLOSED SYSTEM FOR PLACING INSTALLATIONS, ESPECIALLY ELECTRICAL ONES

TECHNICAL FIELD

The invention relates to the installation systems, in particular to a closed system intended to place electrical installations in particular.

BACKGROUND OF THE INVENTION

Closed systems are used to place electrical installations, including lighting systems used mainly in industrial plants. This is due to the safety requirements applicable in various industrial environments. These closed systems consist of interconnected chamber modules. Different electrical devices are situated in the modules in accordance with the purpose of installation—LED lighting, splitters, transformers, etc. At the same time, the modules serve as a passage of the respective connecting cables.

The so-far known electrical installation systems use screws to connect the modules, which means that the appropriate number of threaded holes in the modules is required. The same applies to joining parts that make up modules. Given the larger number of screw connections used, the time required for the production of modules and their installation in systems is increased.

The problem of the above-mentioned known systems for the placing the electrical installations is also to ensure the permanent functionality of the described screw connections and thus to ensure high operational reliability and functionality of the systems.

BRIEF SUMMARY OF THE INVENTION

The goal of the invention is to provide a closed system for placing installations, in particular electrical ones, which is reliable in terms of functionality with respect to the required safety in industrial operations, where the system should remain relatively simple in terms of both manufacture and assembly.

This said goal is achieved through a closed system for placing installations, in particular electrical ones, which is formed by interconnected chamber modules according to the invention, which is characterized in that the chamber modules have a polygonal, in particular rectangular shape and in the area of their connection adjacent modules are provided with lowered overlapping edges, and in the overlap area vertical through holes are provided for the module fasteners. This eliminates the need for threads in module housings.

Advantageously, the lowered edges are provided in the horizontal abutting surfaces with horizontal coaxial passages connecting the chambers of adjacent modules.

The fasteners are appropriately formed by screws and nuts.

To prevent damage to the cables, the passages connecting the chambers of adjacent modules are provided with a grommet.

Preferably, the grommet is made of a resilient material, thereby sealing.

A threaded gland may also be used.

The chamber modules consist of two caps attached to each other.

EXAMPLES OF INVENTION EMBODIMENT

Figure 1:
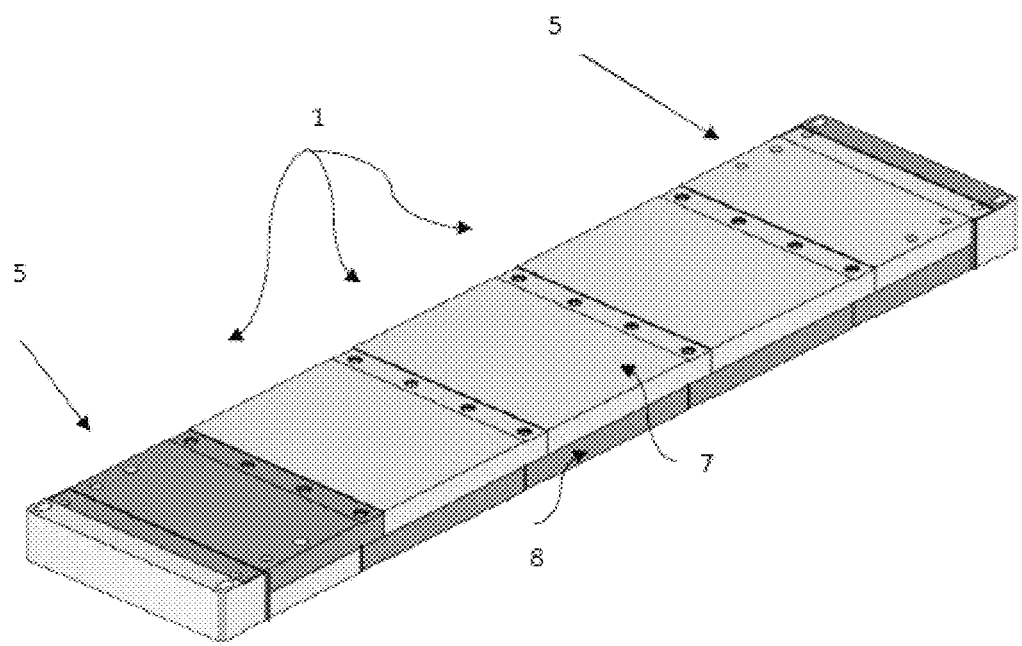
FIG. 1 is an example of linear assembly of S-modules and end modules.
Figure 2:
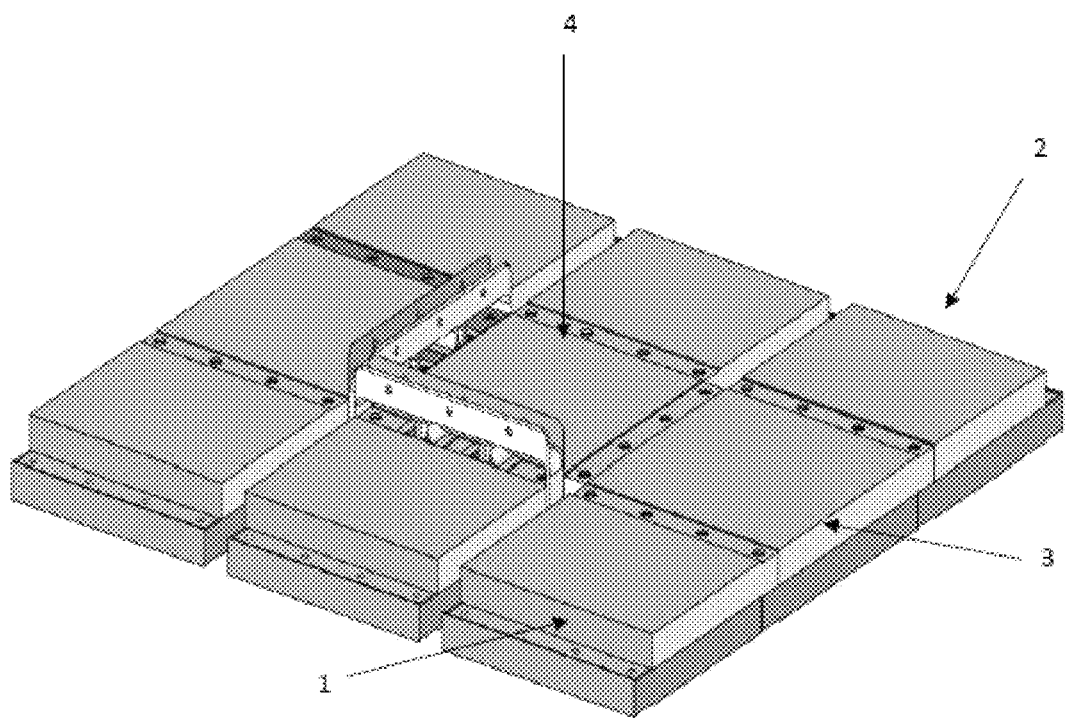
FIG. 2 shows the X-module, S-module, T-module and A-module assembly.

The closed system for placing electrical installations is, according to FIG. 1, formed by interconnected three chamber S-modules 1 and two end modules 5. According to FIG. 2, the closed system consists of one chamber X-module 4, four chamber S-modules 1, two chamber T-modules 3 a two chamber A-modules 2. All modules 1, 2, 3, 4, 5 are formed by two adjacent caps 7, 8 and feature a rectangular shape in top view. This shape may be polygonal or even circular within the scope of the invention. In the connection area, adjacent modules 1, 2, 3, 4, 5 are provided with lowered edges that overlap. The connection areas thus provided have S-modules 1 a A-modules 2 on two opposite sides, T-modules 3 on three sides, X-modules 4 on all four sides and the end module 5 on only one side. The modules contain their own electrical installation, as well as lighting elements, measuring instruments, computer equipment, etc. according to the required use.

Figure 3:
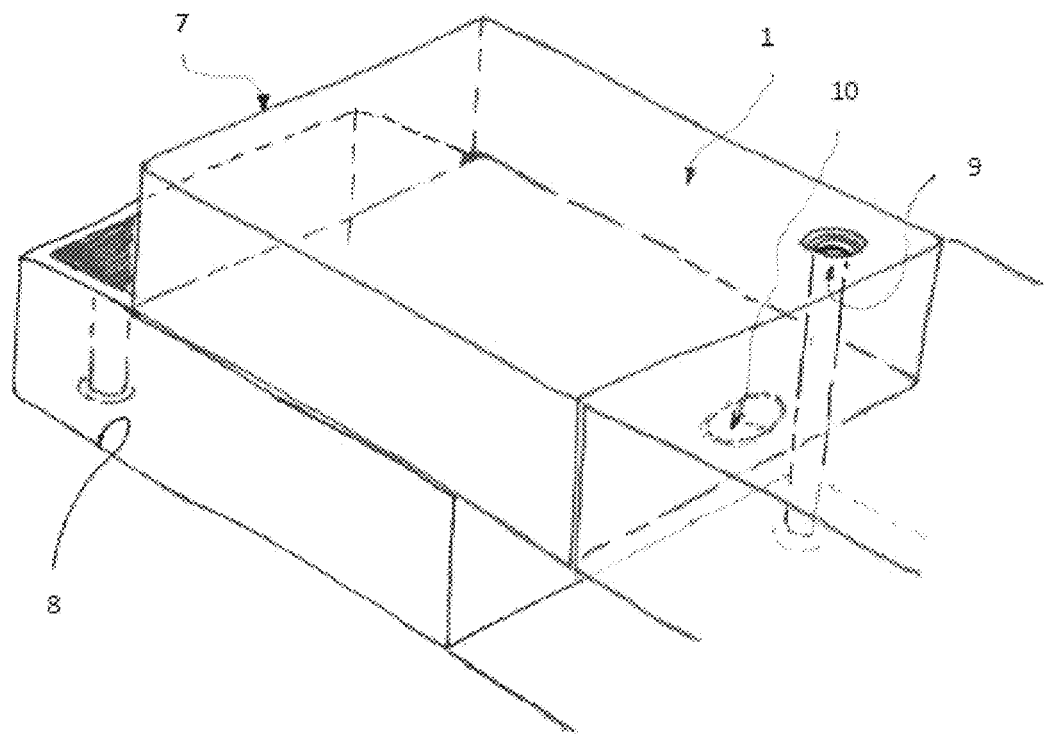
FIG. 3 shows the connecting part of two S-modules in the diagram.
Figure 4:
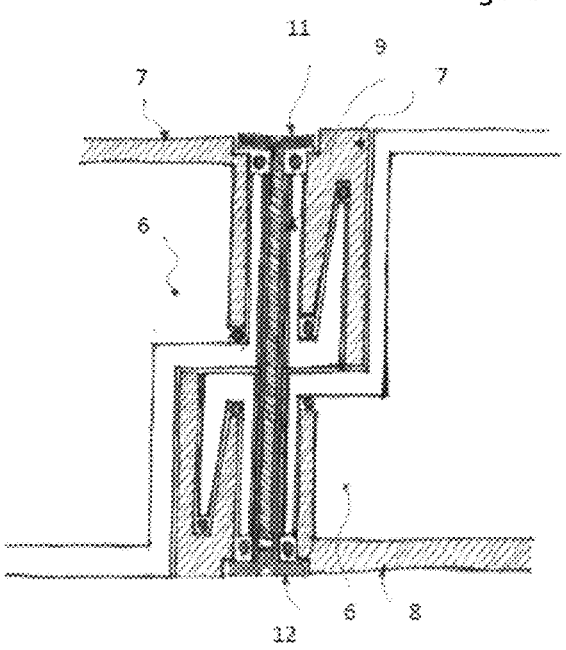
FIG. 4 is a sectional view of the two S-modules overlapping at the connection opening.

As apparent from FIGS. 3 and 4, vertical through holes 9 are formed in the overlap area for fasteners, which are screws 11 and nuts 12. They are used to connect the adjacent modules 1, 2, 3, 4, 5 together, as well as the caps 7, 8.

Figure 5:
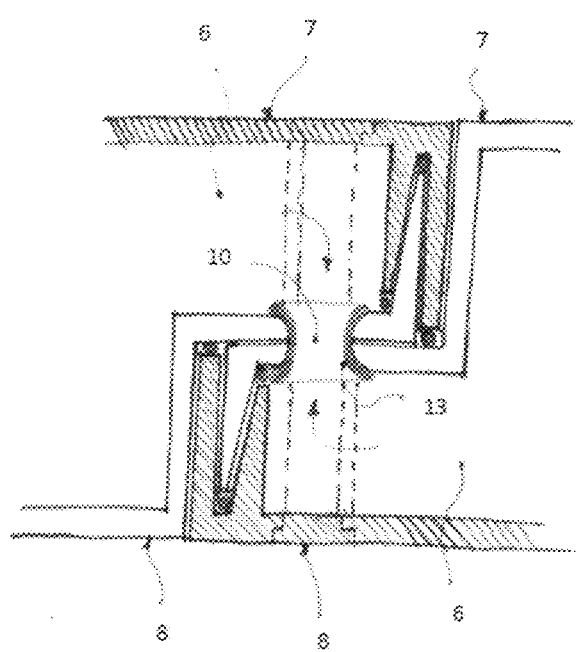
FIG. 5 is a sectional view of the two S-modules overlapping at the point of passage.

In the horizontal abutting areas of the overlap, passages 10 are formed between the chambers 6 of adjacent modules and cables pass through these passages 10—as shown in FIGS. 3 and 5. The passages 10 connecting the chambers 6 of the adjacent modules 1, 2, 3, 4, 5 are provided with a sealing grommet 13, which also protects the cables from damage due to sharp edges of the passages 10. A different grommet may also be used within this invention, e.g. standard threaded grommet.

FIGS. 4 and 5 show unmarked seals between the caps 7 and 8. These seals may also be formed by other known methods within the scope of the invention.

Modules 1, 2, 3, 4, 5 are designed as castings of metal alloys, or they may be made of plastics alternatively.

Now describing two versions of FIG. 5 lined up horizontally, it can be appreciated that the portion of cap 7 lacking from the left side of the left-hand side cap 7, is equivalent to the portion illustrated in the right hand side cap 7. Thus, there is a first horizontal wall having a first end and a second end; a second horizontal wall having a first end and a second end; a first vertical wall connecting the first end of the first horizontal wall to the second end of the second horizontal wall; a second vertical wall extending from the second end of the first horizontal wall, toward the second horizontal wall, the second vertical wall including slot having an opening facing away from the first horizontal wall; and a wedge extending from the first end of the second horizontal wall, away from the first horizontal wall and from the second horizontal wall.

INDUSTRIAL APPLICATION

The closed system for placing the installation according to the invention is particularly intended for electrical installations. It is mainly useful in the environments requiring high security, for the lighting of internal and external industrial operations, storages, wells, docks, airports or as public lighting, both outdoors and in buildings. The closed system according to the invention is also resistant to various weather conditions.

The invention claimed is:

1. A closed system for placing electrical installations, the system comprising:
  a plurality of chamber modules, each chamber module having a polygonal shape and including:
    an upper module component;
    a lower module component;
    a spatial overlap area at which the upper module component and lower module component spatially overlap;
    an overhang extending outwardly from the upper module component out of the overlap area, the overhang including a through-going overhang bore; and
    a lip extending outwardly from the lower module component out of the overlap area, the lip including a through-going lip bore,
  wherein, for each pair of adjacent chamber modules of the plurality of chamber modules, the overhang of a first chamber module of said pair of adjacent chamber modules overlaps the lip of a second chamber module of said pair of adjacent chamber modules, such that the overhang bore of the first chamber module is aligned with the lip bore of the second chamber module, and
  a plurality of fasteners, each affixing the first and second chamber modules of a corresponding said pair of adjacent chamber modules and extending between the overhang bore of the first chamber module and the lip bore of the second chamber module of the corresponding pair of adjacent chamber modules.

2. The system of claim 1, wherein the plurality of fasteners each extend vertically through the overhang bore and the lip bore of the corresponding pair of adjacent chamber modules.

3. The system of claim 1, wherein, for each said pair of adjacent chamber modules, a horizontal surface of the overhang of the first chamber abuts a horizontal surface of the lip of the second chamber, and wherein the system further comprising a horizontal coaxial passage connecting the first chamber module to the second chamber module.

4. The system of claim 3, further comprising a grommet sealing the horizontal coaxial passage.

5. The system of claim 4, wherein the grommet is threaded.

* * * * *